(12) United States Patent
Yang et al.

(10) Patent No.: US 7,420,403 B2
(45) Date of Patent: Sep. 2, 2008

(54) LATCH CIRCUIT AND FLIP-FLOP

(75) Inventors: Yil Suk Yang, Daejeon (KR); Jong Dae Kim, Daejeon (KR); Tae Moon Roh, Daejeon (KR); Dae Woo Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 26 days.

(21) Appl. No.: 11/520,165

(22) Filed: Sep. 13, 2006

(65) Prior Publication Data

US 2007/0132495 A1 Jun. 14, 2007

(30) Foreign Application Priority Data

Dec. 8, 2005 (KR) ........................ 10-2005-0119607
May 16, 2006 (KR) ........................ 10-2006-0043749

(51) Int. Cl.
*H03K 3/00* (2006.01)
(52) U.S. Cl. ..................... 327/218; 327/202; 326/93
(58) Field of Classification Search ............... 326/93, 326/95, 98; 327/218, 202, 203, 208–212
See application file for complete search history.

(56) References Cited

U.S. PATENT DOCUMENTS

| | | | |
|---|---|---|---|
| 5,811,992 A | 9/1998 | D'Souza | |
| 6,211,713 B1 * | 4/2001 | Uhlmann | ..................... 327/211 |
| 6,522,171 B2 | 2/2003 | Hanson et al. | |
| 6,538,471 B1 | 3/2003 | Stan et al. | |
| 6,566,927 B2 | 5/2003 | Park et al. | |
| 6,677,795 B2 * | 1/2004 | Itoh | ........................... 327/202 |
| 6,690,221 B1 * | 2/2004 | Chang | .......................... 327/199 |
| 6,861,887 B2 | 3/2005 | Jeong et al. | |
| 2003/0212917 A1 * | 11/2003 | Yoshitomi et al. | ............ 713/400 |
| 2003/0218231 A1 | 11/2003 | Sani et al. | |
| 2004/0021493 A1 | 2/2004 | Jeong et al. | |
| 2004/0061135 A1 * | 4/2004 | Ikeno et al. | ................... 257/200 |
| 2004/0095176 A1 * | 5/2004 | Uvieghara | ................... 327/202 |

OTHER PUBLICATIONS

Stan, M.R.; Barcella, M., "MTCMOS with outer feedback (MTOF) flip-flops," Circuits and Systems, 2003. ISCAS '03. Proceedings of the 2003 International Symposium on , vol. 5, no., pp. V-429-V-432 vol. 5, May 25-28, 2003.*

* cited by examiner

*Primary Examiner*—Rexford Barnie
*Assistant Examiner*—Jany Tran
(74) *Attorney, Agent, or Firm*—Ladas & Parry LLP

(57) ABSTRACT

A high-reliability, multi-threshold complementary metal oxide semiconductor (CMOS) latch circuit is presented that uses both low and high threshold inverters. The multi-threshold latch circuit includes: a low threshold forward clock inverter inverting an input-terminal logic state and applying the inverted logic state to an output-terminal logic state when a clock is in a first logic state; and a high threshold backward clock inverter forming a circular latch structure together with the forward clock inverter, and inverting an input-terminal logic state and applying the inverted logic state to an output logic state when the clock is in a second logic state.

6 Claims, 4 Drawing Sheets

LATCH CIRCUIT AND FLIP-FLOP

CROSS-REFERENCE TO RELATED APPLICATION

This application claims priority to and the benefit of Korean Patent Application Nos. 2005-119607, filed Dec. 8, 2005, and 2006-43749, filed May 16, 2006, the disclosures of which are incorporated herein by reference in their entirety.

BACKGROUND

1. Field of the Invention

The present invention relates to a multi-threshold complementary metal oxide semiconductor (CMOS) latch circuit capable of ensuring high reliability and suppressing sub-threshold leakage current.

2. Discussion of Related Art

Semiconductor transistor devices can be classified into low threshold transistors and high threshold transistors according to threshold voltage. A low threshold transistor has a guaranteed high response speed even at low supply voltage, but consumes a large amount of power due to sub-threshold leakage current. In contrast, a high threshold transistor has a small leakage current and thus consumes little power, but shows deteriorated characteristics, such as a low response speed, at low supply voltage. When a latch or flip-flop is implemented by the low threshold transistor, sub-threshold leakage current may cause the loss of internal information of the latch or flip-flop, i.e., stored data.

The present era in the art is referred to as the deep sub-micron (DSM) era because the gate length of a semiconductor transistor has been reduced to less than 0.1 micron. In the DSM era, high power consumption due to sub-threshold leakage current is a major concern. As the gate length of a transistor is shortened and the threshold voltage is lowered, sub-threshold leakage current increases in proportion to the exponential of a voltage difference between a drain and source. Therefore, in the DSM era, a new sequential circuit structure that can prevent loss of power and/or data caused by sub-threshold leakage current is extremely important.

In the DSM era, a multi-threshold CMOS (MTCMOS) structure, MTCMOS being a power gating technique, and a variable threshold CMOS (VTCMOS) structure performing back bias voltage control are widely used as structures reducing sub-threshold leakage current.

FIG. 1 is a block diagram of a conventional MTCMOS circuit, which comprises a low threshold circuit block consisting of low threshold transistors or gates, and high threshold transistors P1 and N1 connected to a supply voltage terminal VCC and a ground voltage terminal GND. In normal operation, a sleep signal SLEEP is "low." In a sleep mode, the sleep signal SLEEP becomes "high," and the transistors P1 and N1 both are turned off. Thus, the transistors P1 and N1 are floated from the supply voltage terminal VCC and ground voltage terminal GND, and go into a virtual supply voltage state and a virtual ground voltage state.

FIG. 1 shows a structure controlling power supply of the circuit block consisting of low threshold transistor devices by the high threshold transistors to suppress leakage current. In the structure, the power line of the conventional MTCMOS circuit block is floated from normal voltage, and then shifts back to a normal state. Therefore, power line bounce may occur, and the total area increases because of the high threshold transistors for power gating.

FIG. 2 is a circuit diagram of a conventional VTCMOS device. A transistor illustrated in FIG. 2 is a low threshold transistor that adjusts a threshold voltage by controlling a back bias voltage and thus can reduce leakage current. Therefore, it is possible to efficiently reduce leakage current by substituting the transistor of FIG. 2 for each low threshold transistor included in a circuit block inside a chip. However, a process of fabricating a structure for applying a back bias voltage in a circuit block is complicated, an additional back bias voltage generator circuit is required, and a body factor makes it hard to control threshold voltage as the structure is scaled down.

SUMMARY OF THE INVENTION

The present invention is directed to a multi-threshold complementary metal oxide semiconductor (CMOS) latch circuit and flip-flop capable of preventing leakage current and/or data loss while occupying a smaller area.

The present invention is also directed to a multi-threshold CMOS latch circuit and flip-flop in which power line bounce does not occur.

The present invention is also directed to a multi-threshold CMOS latch circuit and flip-flop that can be fabricated by a simple process.

In order to achieve the objectives, the present invention suggests a latch circuit comprising a combination of a low threshold clock inverter and a high threshold clock inverter, and a flip-flop comprising the latch circuit, wherein the low threshold clock inverter includes a low threshold transistor and can be substituted for inverter devices frequently used in a circuit block inside a chip.

One aspect of the present invention provides a multi-threshold latch circuit comprising: a forward clock inverter including a low threshold transistor only and inverting an input-terminal logic state and applying the inverted logic state to an output-terminal logic state when an execution clock having a low value in a sleep mode section and corresponding to a system clock in a section other than the sleep mode is in a first logic state; and a backward clock inverter including a high threshold transistor, forming a circular latch structure together with the forward clock inverter, and inverting an input-terminal logic state and applying the inverted logic state to an output-terminal logic state when the execution clock is in a second logic state.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the exemplary embodiments disclosed below and can be implemented in various forms. Therefore, the present exemplary embodiments are provided for complete disclosure of the present invention and to fully inform the scope of the present invention to those of ordinary skill in the art.

In the following description of exemplary embodiments, a device consisting of transistors having a low threshold voltage is called a low threshold device, and a device consisting of a transistor having a low threshold voltage as well as a transistor having a high threshold voltage, or only high threshold transistors, is called a high threshold device. To distinguish between a high threshold transistor and a low threshold transistor, in the case of a 130 nm standard transistor operating at 1.2 V, the threshold voltage of a low threshold device is about 0.4 V and the threshold voltage of a high threshold device is about 0.6 V.

In the following description of exemplary embodiments, a state in which a device does not operate but is supplied with a minimum power to immediately begin operation when needed is called a sleep mode, and a state in which a device is operating is called an operation mode. In addition, a clock always having a fixed period is called a system clock, and a clock stopped in the sleep mode and synchronized with the system clock in the operation mode is called an execution clock.

First Exemplary Embodiment

Prior to the description of a latch circuit according to this exemplary embodiment, a clock inverter structure used for forming the latch circuit of this exemplary embodiment will be described.

Figure 1:
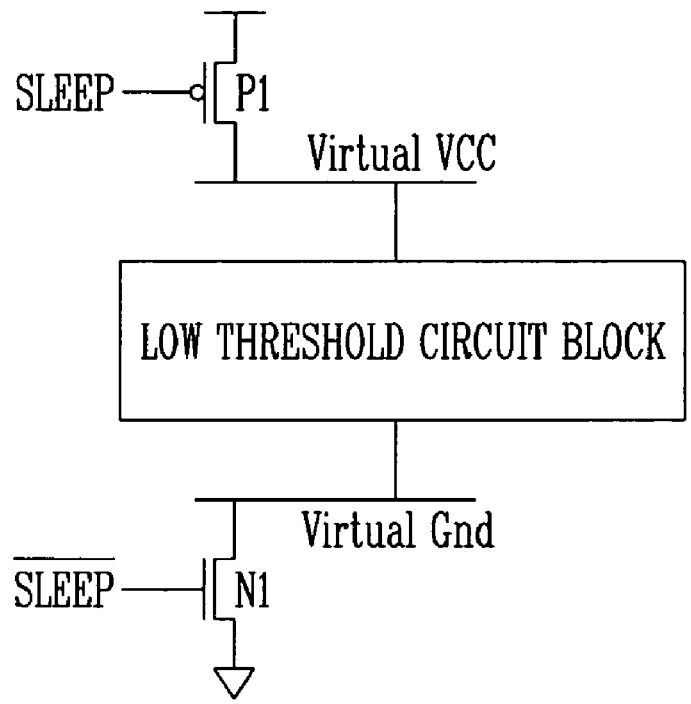
FIG. 1 is a circuit diagram of a conventional multi-threshold voltage complementary metal oxide semiconductor (MTCMOS) circuit block.
Figure 2:
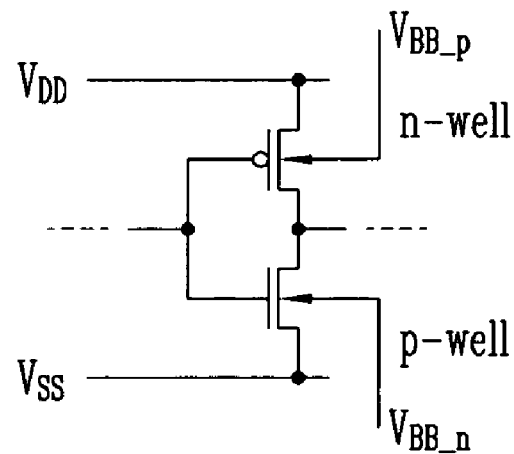
FIG. 2 is a circuit diagram of a conventional variable threshold voltage complementary metal oxide semiconductor (VTCMOS) device.
Figure 3:
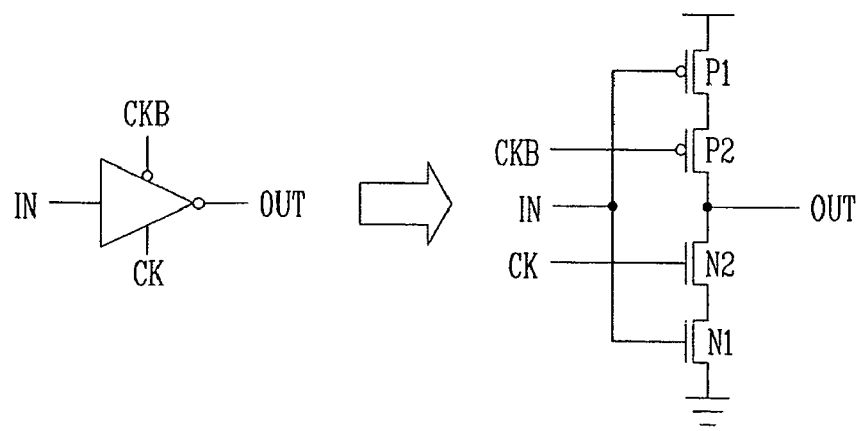
FIG. 3 is a detailed circuit diagram of the structure of a clock inverter used for embodying the spirit of the present invention.

As illustrated in FIG. 3, the clock inverter of this exemplary embodiment comprises a first p-channel metal oxide semiconductor (PMOS) transistor P1, a second PMOS transistor P2, a first n-channel metal oxide semiconductor (NMOS) transistor N1, and a second NMOS transistor N2. The source of the first PMOS transistor P1 is connected to a supply voltage terminal. The source of the second PMOS transistor P2 is connected to the drain of the first PMOS transistor P1, and the drain of the second PMOS transistor P2 is connected to an output terminal. The source of the first NMOS transistor is connected to a ground voltage terminal. The source of the second NMOS transistor is connected to the drain of the first NMOS transistor, and the drain of the second NMOS transistor N2 is connected to the drain of the second PMOS transistor P2.

An input signal applied to the gates of the first PMOS transistor P1 and the first NMOS transistor N1 is inverted and output through the drain of the second PMOS transistor P2, so that the structure functions as an inverter. In addition, an inverted execution clock CKB is applied to the gate of the second PMOS transistor P2, and an execution clock CK is applied to the gate of the second NMOS transistor N2, so that the inverter function is performed in only an enable section of the execution clock CK. An output signal OUT has an inverted output of the input signal IN or a high impedance output synchronized with the execution clock CK and the inverted execution clock CKB.

When the first PMOS transistor P1, the second PMOS transistor P2, the first NMOS transistor N1, and the second NMOS transistor N2 all are implemented by low threshold metal oxide semiconductors (MOSs), it is possible to guarantee a high response speed even in a low supply voltage environment. In addition, although all the transistors are low threshold voltage transistors, sub-threshold leakage current can be minimized due to the four-stack threshold-voltage structure.

Figure 4:
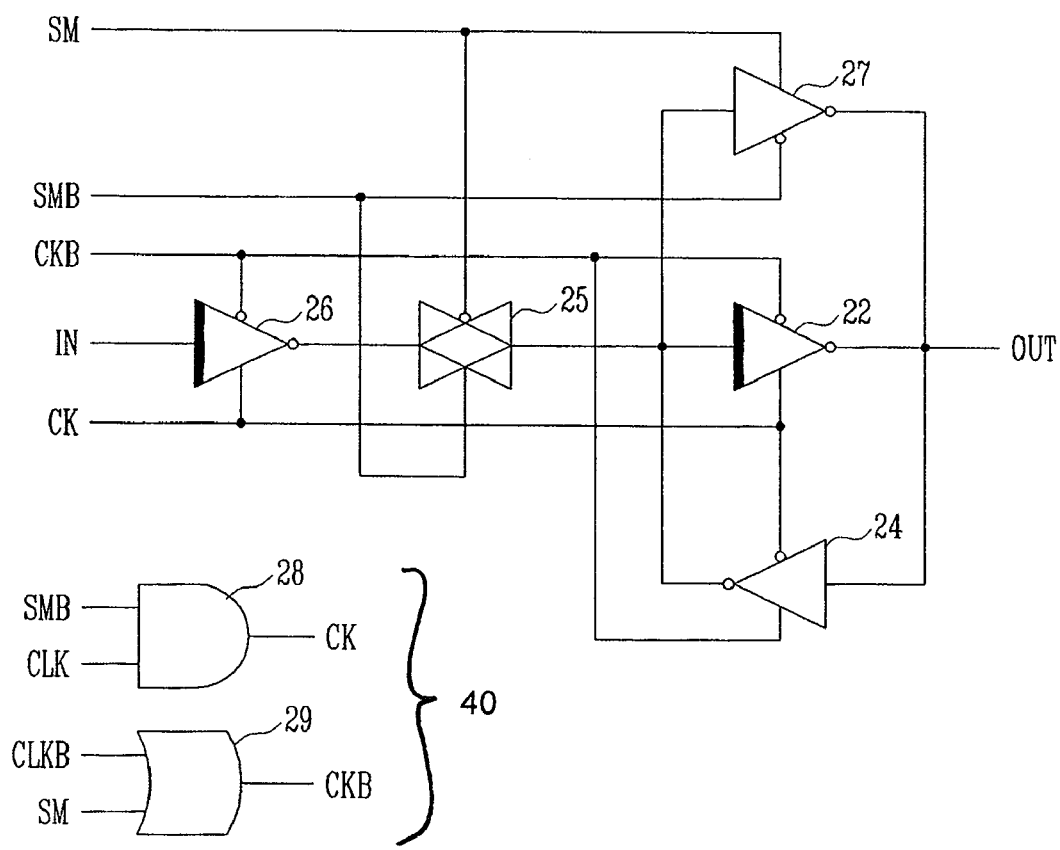
FIG. 4 is a circuit diagram of a latch circuit according to an exemplary embodiment of the present invention.

FIG. 4 illustrates the latch circuit of this exemplary embodiment, which comprises two low threshold clock inverters 22 and 26, a low threshold pass gate 25, two high threshold clock inverters 24 and 27, a high-threshold two-input AND gate 28, and a high-threshold two-input OR gate 29.

In FIG. 4, a signal SM is a sleep mode disable signal that is ActiveLow, and a signal SMB is a sleep mode enable signal that is ActiveLow.

In normal operation, the sleep mode disable signal SM is "low," and the sleep mode enable signal SMB is "high." In sleep mode operation, the sleep mode disable signal SM is "high," and the sleep mode enable signal SMB is "low."

Among the components of the illustrated latch circuit, when the execution clock CK is high, the low threshold forward clock inverter 22 inverts an input-terminal logic state and applies the inverted logic state to an output-terminal logic state. And, the high threshold backward clock inverter 24 forms a circular latch structure together with the low threshold forward clock inverter 22, and when the execution clock CK is low, inverts an input-terminal logic state and applies the inverted logic state to an output-terminal logic state. The spirit of the present invention is embodied by the low threshold forward clock inverter 22 and the high threshold backward clock inverter 24.

Here, in a sleep mode section, i.e., a stationary section in which the latch circuit does not operate, the execution clock CK is kept in a low state. To this end, the latch circuit should have a clock mode generation block 40 for generating the execution clock CK from a system clock CLK and the sleep mode disable signal SM. In FIG. 4, the clock mode generation block 40 is implemented by the two-input high threshold AND gate 28 receiving the inverted sleep mode enable signal SMB and the system clock CLK and generating the execution clock CK, and the two-input high threshold OR gate 29 receiving the sleep mode disable signal SM and an inverted system clock CLKB and generating the inverted execution clock CKB.

Since the clock mode generation block 40 should accurately maintain a sleep mode, it is preferably implemented by a high threshold device. To this end, the high threshold AND gate 28 and the high threshold OR gate 29 may have at least one high threshold transistor (a high threshold MOS transistor in the case of a MOS transistor chip).

The low threshold forward clock inverter 22 latching input data when the execution clock CK is in the high state is implemented by a low threshold device, and thus can guarantee a fast latch operation even at low supply voltage. In addition, since operation of the low threshold forward clock inverter 22 is stopped in the sleep mode and the high threshold backward clock inverter 24 for maintaining a latch value is implemented by a high threshold device, it is possible to prevent waste of power and/or data loss caused by leakage current of the low threshold device. Preferably, the low threshold forward clock inverter 22 may be implemented by a clock inverter having the structure of FIG. 3 consisting of four low threshold voltage MOS transistors, P1, P2, N1, and N2.

In the illustrated latch circuit, the main path through which data is transmitted is configured of the two low threshold voltage clock inverters 22 and 26 and the low threshold voltage pass gate 25, and a feedback path is configured of the two high threshold voltage clock inverters 24 and 27.

Here, when the execution clock CK is high, the input terminal clock inverter 26 inverts an input-terminal logic state, applies the inverted logic state to an output-terminal logic state, and transfers the output-terminal logic state to the input terminal of the low threshold forward clock inverter 22, thereby serving to invert an input signal and make the logic state of the input signal of the latch circuit coincide with the logic state of an output signal. Since the input terminal low threshold clock inverter 26 receives the same clock as the low threshold forward clock inverter 22, it is preferably implemented by only low threshold transistors.

In the sleep mode, the low threshold pass gate 25 serves to block between the output terminal of the low threshold input terminal clock inverter 26 and the input terminal of the forward low threshold clock inverter 22. To be synchronized with the operation speeds of the forward low threshold clock inverter 22 and the low threshold input terminal clock inverter 26, the low threshold pass gate 25 is preferably implemented by low threshold transistors only.

In order to maintain a value latched just before the sleep mode during the sleep mode, the latch circuit has the high threshold backward clock inverter 24 including a high MOS transistor. However, in order to obtain improved stability, the latch circuit may further include the high threshold sleep mode clock inverter 27, which is a high threshold clock inverter forming a circular latch structure together with the high threshold backward clock inverter 24, as illustrated in FIG. 4. The illustrated high threshold sleep mode clock inverter 27 operates corresponding to the inverted states of the sleep mode signals SM and SMB, and does not operate in a normal mode, thus not interfering with the operation of the low threshold forward clock inverter 22.

In normal operation, the input-terminal signal IN is transferred or stored as the output terminal signal OUT through the two low threshold voltage clock inverters 26 and 22, the low threshold voltage pass gate 25, and the high threshold voltage clock inverter 24, by the system clocks CLK and CLKB. However, the high threshold voltage clock inverter 27 is turned off by the sleep mode signals SM and SMB, thus not operating.

In sleep mode operation, the execution clock CK becomes "low" and the inverted execution clock CKB becomes "high" unconditionally by the high threshold two-input AND gate 28 and the high threshold two-input OR gate 29, regardless of the system clocks CLK and CLKB. Thus, the two low threshold voltage clock inverters 26 and 22 and the low threshold voltage pass gate 25 are turned off, only the high threshold voltage clock inverters 24 and 27 are turned on, and the output terminal signal OUT of the latch circuit is maintained at the latch value just before the sleep mode.

Second Exemplary Embodiment

Figure 5:
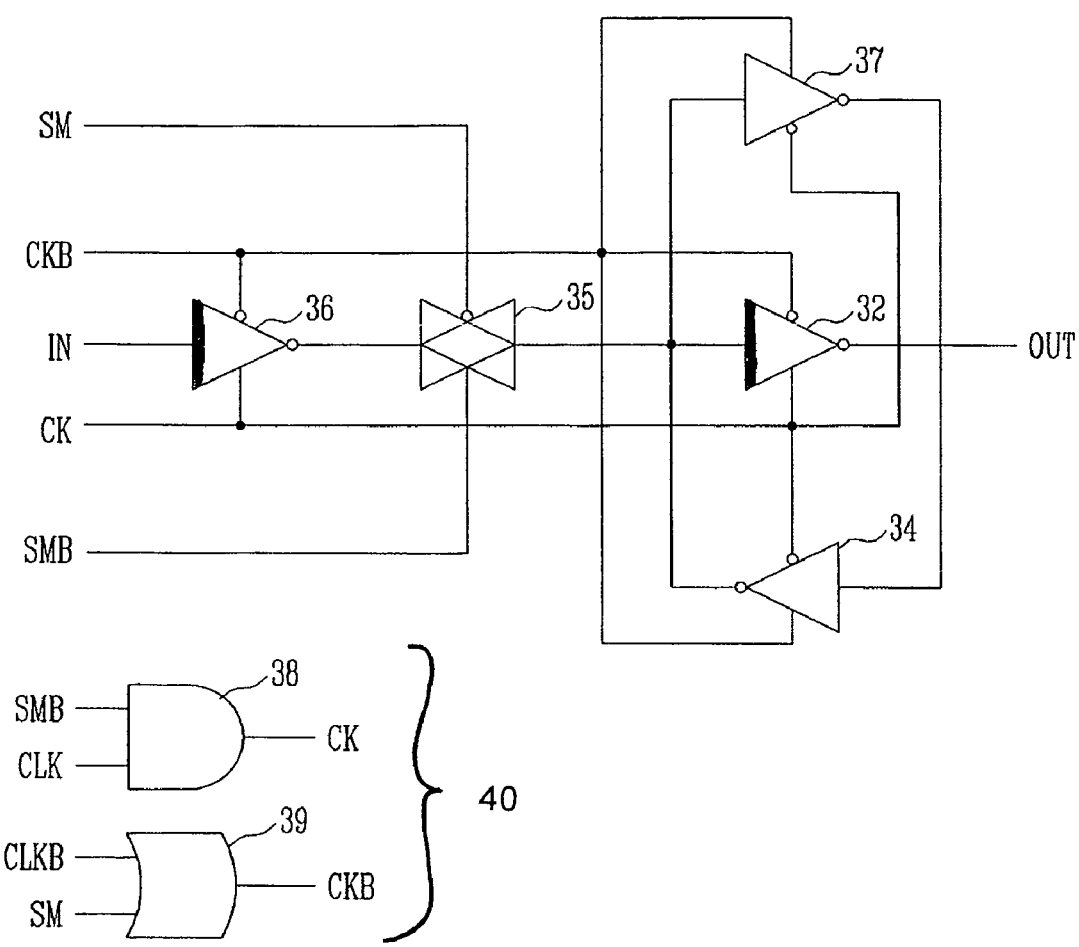
FIG. 5 is a circuit diagram of a latch circuit according to another exemplary embodiment of the present invention.

FIG. 5 illustrates a latch circuit of this exemplary embodiment, which comprises two low threshold clock inverters 32 and 36, a low threshold pass gate 35, two high threshold clock inverters 34 and 37, a high threshold two-input AND gate 38, and a high threshold two-input OR gate 39. Preferably, the low threshold clock inverter illustrated in FIG. 3 may be applied in this exemplary embodiment also.

Similar to the first exemplary embodiment, in the latch circuit of this exemplary embodiment, the spirit of the present invention is embodied by the low threshold forward clock inverter 32 and the high threshold backward clock inverter 34 among the components of the illustrated latch circuit. When an execution clock CK is high, the low threshold forward clock inverter 32 inverts an input-terminal logic state and applies the inverted logic state to an output logic state. The high threshold backward clock inverter 34 forms a circular latch structure together with the low threshold forward clock inverter 32, and when the execution clock CK is low, inverts an input-terminal logic state and applies the inverted logic state to an output-terminal logic state. On the other hand, this exemplary embodiment is distinguished from the first exemplary embodiment in that it has a low threshold forward clock inverter 37 for a negative (−) section having the same clock input structure as the high threshold backward clock inverter 34 and forming a circular latch structure. The low threshold forward clock inverter 37 for a negative (−) section is formed at a position corresponding to the position of the sleep mode clock inverter 27 of the first exemplary embodiment, but has a difference in that input clocks are the same as the high threshold backward clock inverter 34. Hereupon, the low threshold forward clock inverter 37 for a negative (−) section forms the circular latch structure together with the high threshold backward clock inverter 34 in a section in which the execution clock CK is low, thereby serving to maintain a latch value. Since the execution clock CK is low in a sleep mode section, the low threshold forward clock inverter 37 for a negative (−) section also serves to prevent data loss in a sleep mode. The other components except the low threshold forward clock inverter 37 for a negative (−) section are the same as in the first exemplary embodiment, and thus the description thereof will be omitted.

Third Exemplary Embodiment

Figure 6:
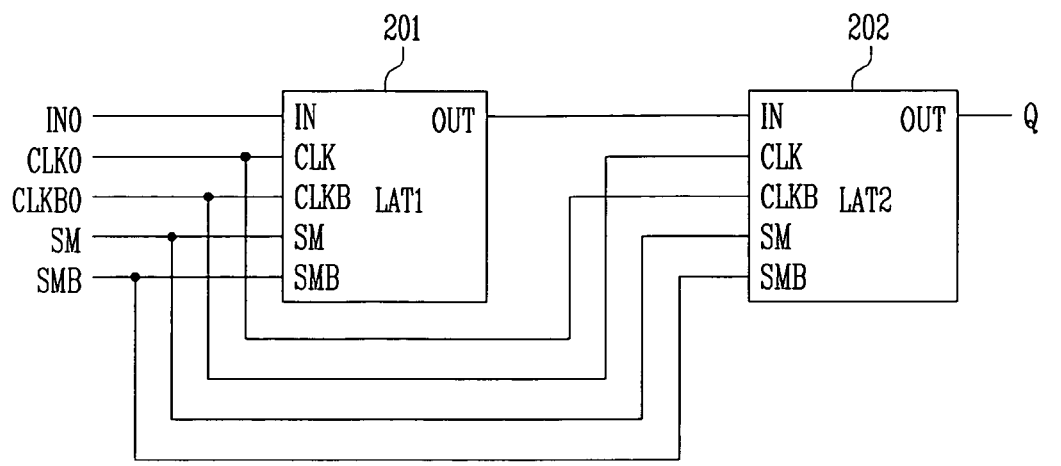
FIG. 6 illustrates a circuit diagram and timing diagram of a flip-flop implemented by latch circuits in the spirit of the present invention.
Figure 6:
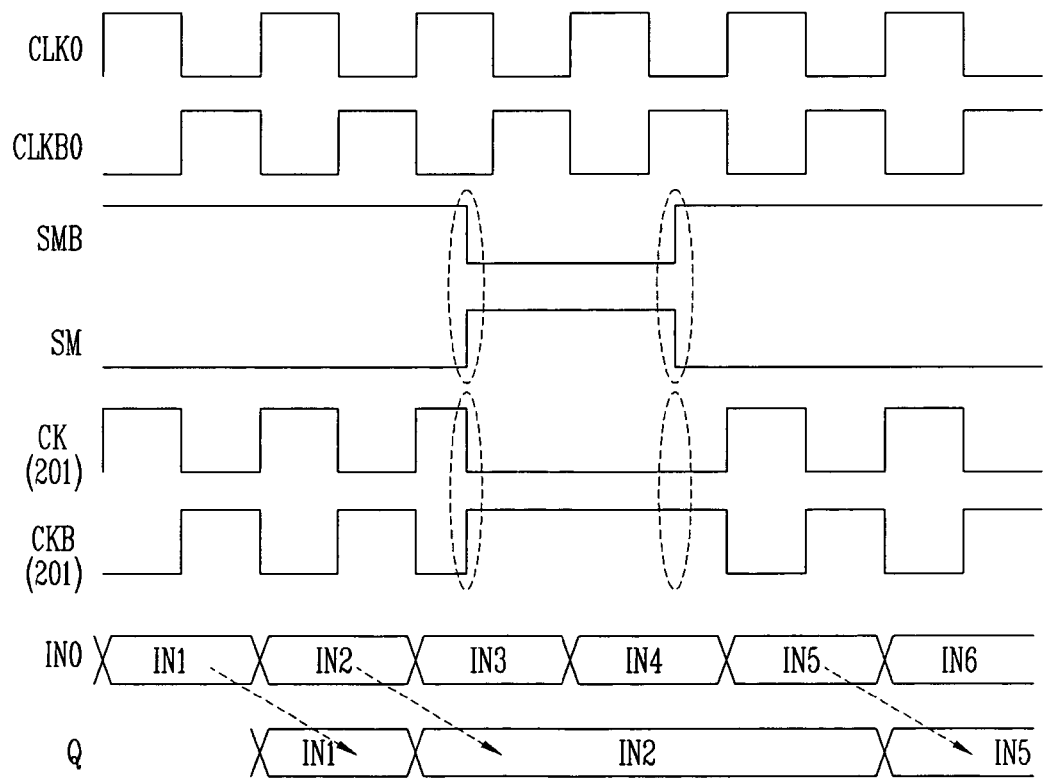

The flip-flop of this exemplary embodiment is implemented by two latch circuits in the spirit of the present invention. FIG. 6 illustrates a block diagram and timing diagram of the flip-flop of this exemplary embodiment. The illustrated flip-flop comprises a first latch circuit LAT1 and 201 receiving input signals IN0, CLK0, CLKB0, SM and SMB, and a second latch circuit LAT2 and 202. The first latch circuit 201 and the second latch circuit 202 are embodied in the spirit of the present invention, and may have the structure of the first exemplary embodiment or the second exemplary embodiment.

The illustrated flip-flop comprises the first latch circuit 201 and the second latch circuit 202 receiving an output signal of the first latch circuit 201. The first latch circuit 201 and the second latch circuit 202 are supplied with the same sleep mode signals SM and SMB. However, the system clock CLK0 applied from the outside is input to the first latch circuit LAT1 as is, and is inverted and input to the second latch circuit LAT2. Thus, the system clocks of the latch circuits are reciprocally inverted.

The illustrated flip-flop circuit is synchronized with the rising edge of an execution clock CK generated by logically combining the system clock signal CLK0 and the sleep mode signals SM and SMB, and transfers the input signal IN0 to an output signal Q.

As illustrated in the timing diagram, when the sleep mode enable signal SMB and the sleep mode disable signal SM are respectively "high" and "low," the flip-flop operates normally. And, when the signals SMB and SM are respectively "low" and "high," the output signal Q of the flip-flop is maintained to have a previous value regardless of the signals CK0, CKB0, and IN0. This is because an input-terminal signal IN of each latch circuit 201 and 202 is not transferred to an output-terminal signal OUT of the latch circuit in a sleep mode section.

The multi-threshold CMOS latch circuit or flip-flop configured as described above according to the present invention makes it possible to efficiently prevent leakage current and/or data loss while occupying a smaller area in a semiconductor chip.

In addition, the present invention prevents power line bounce caused by a power gating technique, and also can be fabricated by a simple process.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A latch circuit comprising:
   a low threshold forward clock inverter inverting an input-terminal logic state and applying the inverted logic state to an output-terminal logic state when an execution clock having a low value in a sleep mode section and corresponding to a system clock in a section other than the sleep mode is in a first logic state;
   a low threshold input terminal clock inverter inverting an input-terminal logic state, applying the inverted logic state to an output-terminal logic state, and transferring the output-terminal logic state to the input terminal of the low threshold forward clock inverter when the execution clock is in the first logic state;
   a low threshold pass gate connecting an output terminal of the input terminal clock inverter with the input terminal of the low threshold forward clock inverter in a normal mode, and blocking the connection in the sleep mode; and
   a high threshold backward clock inverter forming a circular latch structure together with the low threshold forward clock inverter, and inverting an input-terminal logic state and applying the inverted logic state to an output-terminal logic state when the execution clock is in a second logic state.

2. The latch circuit of claim 1, further comprising:
   a high threshold clock mode generation block receiving the system clock and a sleep mode signal, and generating the execution clock in the sleep mode; and
   a high threshold sleep mode clock inverter inverting an input-terminal logic state and applying the inverted logic state to an output-terminal logic state, and forming a circular latch structure together with the high threshold backward clock inverter.

3. The latch circuit of claim 1, further comprising:
   a high threshold clock mode generation block receiving the system clock and a sleep mode signal, and generating the execution clock in the sleep mode; and
   a high threshold forward clock inverter for a negative (−) section forming a circular latch structure together with the high threshold backward clock inverter, and maintaining data when the execution clock is in the second logic state.

4. The latch circuit of claim 2 or 3, wherein the high threshold clock mode generation block comprises:
   a high threshold AND gate receiving a sleep mode disable signal and the system clock, and generating the execution clock; and
   a high threshold OR gate receiving a sleep mode enable signal and an inverted system clock, and generating an inverted execution clock.

5. The latch circuit of claim 1 further comprising a high threshold clock mode generation block comprises:
   a high threshold AND gate receiving a sleep mode disable signal and the system clock, and generating the execution clock; and
   a high threshold OR gate receiving a sleep mode enable signal and an inverted system clock, and generating an inverted execution clock.

6. A flip-flop comprising:
   a first latch circuit according to claim 1; and
   a second latch circuit according to claim 1 and receiving an output signal of the first latch circuit,
   wherein a same sleep mode signal is applied to the first latch circuit and the second latch circuit, and reciprocally inverted external clocks are respectively applied to the first latch circuit and the second latch circuit.

* * * * *